United States Patent
Fitzmorris et al.

(10) Patent No.: US 11,676,749 B2
(45) Date of Patent: Jun. 13, 2023

(54) CO-SHELLING OF MAGNETIC NANOPARTICLES AND QUANTUM DOTS WITH OXIDE MATERIAL

(71) Applicant: OSRAM Opto Semiconductors GmbH, Regensburg (DE)

(72) Inventors: Robert Fitzmorris, Portland, OR (US); Brian Theobald, Gladstone, OR (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 36 days.

(21) Appl. No.: 17/349,971

(22) Filed: Jun. 17, 2021

(65) Prior Publication Data
US 2022/0406500 A1    Dec. 22, 2022

(51) Int. Cl.
| | | |
|---|---|---|
| *H01F 1/11* | (2006.01) |
| *C01F 7/02* | (2022.01) |
| *C01G 49/08* | (2006.01) |
| *C09K 11/56* | (2006.01) |
| *C09K 11/88* | (2006.01) |
| *H01F 1/00* | (2006.01) |
| *H01L 33/50* | (2010.01) |
| *B82Y 20/00* | (2011.01) |
| *B82Y 25/00* | (2011.01) |
| *B82Y 30/00* | (2011.01) |
| *B82Y 40/00* | (2011.01) |

(52) U.S. Cl.
CPC ............... *H01F 1/11* (2013.01); *C01F 7/02* (2013.01); *C01G 49/08* (2013.01); *C09K 11/565* (2013.01); *C09K 11/883* (2013.01); *H01F 1/0063* (2013.01); *H01L 33/502* (2013.01); *B82Y 20/00* (2013.01); *B82Y 25/00* (2013.01); *B82Y 30/00* (2013.01); *B82Y 40/00* (2013.01); *C01P 2004/64* (2013.01); *C01P 2004/84* (2013.01); *C01P 2006/42* (2013.01); *H01L 2933/0041* (2013.01)

(58) Field of Classification Search
CPC ....... H01F 1/11; H01F 1/0063; C09K 11/883; C09K 11/02; C09K 11/565; H01L 33/502; H01L 2933/0041; B82Y 20/00; B82Y 25/00; C01P 2004/62; C01P 2004/84; C01P 2006/42

See application file for complete search history.

(56) References Cited

U.S. PATENT DOCUMENTS

| | | | |
|---|---|---|---|
| 2007/0059705 A1* | 3/2007 | Lu ..................... | G01N 33/54326 435/6.12 |
| 2009/0280327 A1 | 11/2009 | Ying et al. | |
| 2011/0297871 A1 | 12/2011 | Woo et al. | |
| 2016/0300981 A1 | 10/2016 | Woo et al. | |

FOREIGN PATENT DOCUMENTS

CN          111100612 A       5/2020

OTHER PUBLICATIONS

Wheeler et al., "Magnetic Fe3O4-Au core-shell nanostructures for surface enhanced Raman scattering", Ann. Phys. (Berlin) 524, No. 11, 2012, pp. 670-679.
Adams et al., "Fe3O4@SiO2 Nanoparticles Functionalized with Gold and Poly(vinylpyrrolidone) for Bio-Separation and Sensing Applications", ACS Appl. Nano Mater., 2018, 1, pp. 1406-1412.

* cited by examiner

*Primary Examiner* — C Melissa Koslow
(74) *Attorney, Agent, or Firm* — Viering, Jentschura & Partner mbB

(57) ABSTRACT

A wavelength converter material and a method of A method of preparing a wavelength converter material may include providing an optionally oxide coated phosphor material, mixing the optionally oxide coated phosphor material with an optionally oxide coated paramagnetic nanoparticle, coating the optionally oxide coated phosphor material and the optionally oxide coated paramagnetic nanoparticle with an oxide coating, thereby preparing a coated phosphor-nanoparticle particle, and separating the coated phosphor-nanoparticle particle, thereby preparing a wavelength converter material. The separating of the coated phosphor-nanoparticle particle may be manipulated by applying a magnetic field.
Furthermore, a wavelength converter material, as well as a light emitting diode are described herein.

16 Claims, 2 Drawing Sheets

CO-SHELLING OF MAGNETIC NANOPARTICLES AND QUANTUM DOTS WITH OXIDE MATERIAL

TECHNICAL FIELD

This invention relates to a method of preparing a wavelength converter material, a wavelength converter material prepared by a method of the present invention, a wavelength converter material, a light emitting diode and a use of a use of a wavelength converter material.

BACKGROUND

Quantum dots and phosphors are materials beneficial in many applications and are often used in light emitting diode (LED) or solar devices.

A drawback in using quantum dots or other phosphor materials might be the method for preparing the materials, especially the purification of said materials. Common methods for preparing e.g., quantum dots are centrifugation, sedimentation, biphasic extraction, ion exchange chromatography, or tangential flow. Centrifugation is a time intensive, expensive procedure used in the purification of quantum dot (QD) downconverters and in the sedimentation of downconverters on LED packages.

SUMMARY

One objective is to obviate the disadvantages of the prior art.

It is a further objective to provide a method for preparing a wavelength converter material.

It is a further objective to provide a wavelength converter material.

It is a further objective to provide a light emitting diode having the wavelength converter material.

It is a further objective to provide a use of the wavelength converter material.

In accordance with a non-limiting embodiment, a method of preparing a wavelength converter material may include providing one or more phosphor materials optionally coated with an oxide coating, mixing the phosphor material(s) with one or more paramagnetic nanoparticles optionally coated with an oxide coating, coating the phosphor material(s) and the paramagnetic nanoparticle(s) with an oxide coating to form one or more coated phosphor-nanoparticle agglomerates. The method may further include separating the coated phosphor-nanoparticle agglomerate(s) to form the wavelength converter material.

The coated phosphor-nanoparticle agglomerate(s) may be separated by applying a magnetic field to the solution with the agglomerate(s) therein.

In another non-limiting embodiment, a wavelength converter material may include one or more phosphor materials, one or more oxide coatings, and one or more paramagnetic nanoparticles.

In yet another non-limiting embodiment, there is provided a use of a wavelength converter material in a method for purification of downconverters, or in a method of preparing a light emitting diode (LED).

BRIEF DESCRIPTION OF THE DRAWINGS

In the following, a wavelength converter material and a method of making the wavelength converter material described here will be explained in more detail with reference to the drawings using non-limiting embodiments. Identical reference signs specify identical elements in the individual figures. However, no references to scale are shown; rather, individual elements may be shown in exaggerated size for better understanding.

DETAILED DESCRIPTION

Figure 1:
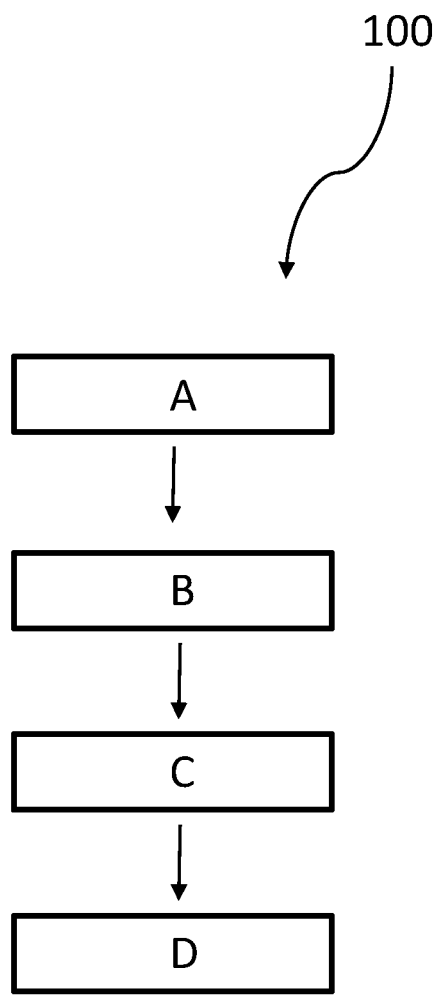
FIG. 1 depicts a method for preparing a wavelength converter.

For a better understanding, together with other and further objects, advantages and capabilities thereof, reference is made to the following disclosure and appended claims taken in conjunction with the above-described drawings.

References to the color of the phosphor, LED, or conversion material refer generally to its emission color unless otherwise specified. Thus, a blue LED emits a blue light, a yellow phosphor emits a yellow light and so on.

A method of preparing a wavelength converter material may include providing one or more phosphor materials optionally coated with an oxide coating, mixing the phosphor material(s) with one or more paramagnetic nanoparticles optionally coated with an oxide coating, coating the phosphor material(s) and the paramagnetic nanoparticle(s) with an oxide coating to form one or more coated phosphor-nanoparticle agglomerate(s), and separating the coated phosphor-nanoparticle agglomerate(s) to form a wavelength converter material. The separating of the coated phosphor-nanoparticle agglomerate(s) may occur by applying a magnetic field.

A wavelength converter material may be prepared. A wavelength converter material may include any material capable of converting at least part of the light of a pre-determined first wavelength to light of a pre-determined second wavelength. In a non-limiting embodiment, the wavelength converter material may convert blue light into light of a second wavelength, e.g. red, yellow, white, etc.

The method may include providing one or more phosphor materials optionally coated with an oxide coating.

Non-limiting phosphors include, but are not limited to, garnets, oxynitridosilicates, perovskites, quantum dots, silicates, or combinations thereof, each doped with at least one appropriate element. In a non-limiting embodiment, the phosphor may be or include LuAG:Ce, LuAGaG:Ce, YAGaG:Ce, YAG:Ce, $Sr(Sr,Ca)Si_2Al_2N_6:Eu^{2+}$, $CaAlSiN_3:Eu^{2+}$, $K_2SiF_6:Mn^{4+}$, $\beta$-$SiAlON:Eu^{2+}$ $(Ba,Sr)_2Si_5N_8:Eu^{2+}$, Ca-$\alpha$-$SiAlON:Eu^{2+}$, $YAG:Ce+CaAlSiN_3:Eu$, $(Ca,Sr)AlSiN_3:Eu^{2+}$, $(Sr,Ca)Al_2Si_2N_6:Eu^{2+}$, $(Ba,Sr,Ca)_2Si_5N_8:Eu^{2+}$, $Sr(LiAl_3N_4):Eu^{2+}$, or combinations thereof.

In a non-limiting embodiment, the phosphor may be or include LuAG:Ce, LuAGaG:Ce, YAGaG:Ce, YAG:Ce, $Sr(Sr,Ca)Si_2Al_2N_6:Eu^{2+}$, $CaAlSiN_3:Eu^{2+}$, $K_2SiF_6:Mn^{4+}$, $\beta$-$SiAlON:Eu^{2+}$, or combinations thereof.

The phosphor may be coated with a suitable oxide coating, such as those described in more detail below.

In a further non-limiting embodiment, the phosphor may be a quantum dot. A quantum dot is a material that comprises a core-shell structure. This means that a specific material forms a core, which is at least partially surrounded by at least one shell material. Some quantum dots do not have a shell, but only comprise a core material. In a non-limiting embodiment, the quantum dot may be or include II-VI structures, e.g., CdS, CdSe, CdTe, ZnO, ZnS, ZnSe, ZnTe, and/or a ternary (CdZnSe, CdZnS, CdSeS, ZnSeS) materials, quaternary materials (CdZnSeS, CdZnTeS), and the like made from these compound semiconductors.

Alternatively, the quantum dot may be selected from III-V structures, e.g., InN, GaN, InP, GaP, AlP, InAs, GaAs, and/or a ternary materials, or quaternary materials made from these compound semiconductors. Further quantum dots may be or include, but are not limited to PbS, PbSe, InAs, GaAs, $CuInSe_2$, $AgInS_2$, $CuGaSe_2$, $CuGaS_2$, perovskites, silicon, or combinations thereof.

The phosphor may be provided in powder form, or the phosphor may be dissolved in a suitable solvent, such as but not limited to, toluene, cyclohexane, ethanol, chloroform, etc.

The phosphor may be coated with a suitable oxide coating, such as those described in more detail below. Non-limiting oxide coatings may include, but are not limited to, silica, alumina, hafnia, or combinations thereof. The oxide coating may at least partially cover or completely cover the surface of the phosphor. The oxide coating may have a thickness ranging from about 1 nm to about 50 nm, such as from about 5 nm to about 15 nm.

The method may include mixing the phosphor material(s) with one or more paramagnetic nanoparticles optionally coated with an oxide coating.

A nanoparticle is a particle that may have a size less than 100 nm, such as from 1 nm to 100 nm, or from 10 nm to 50 nm, or from 20 nm to 30 nm. A paramagnetic nanoparticle may be a nanoparticle having paramagnetic properties. In a non-limiting embodiment, the paramagnetic nanoparticle is a superparamagnetic nanoparticle. Nanoparticles are described e.g., in Wheeler et al. Ann. Phys. (Berlin) 524, No. 11, 670-679 (2012) and Adams et al., ACS Appl. Nano. Mater. 2018, 1, 1406-1412.

The paramagnetic nanoparticle may be coated with a suitable oxide coating, such as those described in more detail below. Non-limiting oxide coatings may be silica, alumina, hafnia, or combinations thereof. The oxide coating may at least partially or completely cover the surface of the paramagnetic nanoparticle(s). The oxide coating may have a thickness ranging from about 1 to about 50 nm, such as from about 5 to about 15 nm.

The mixing of the phosphor material(s) and the paramagnetic nanoparticle(s) may be carried out by any means that are available for mixing materials, e.g. sonication, vortexing, mechanical stirring, shear mixing, or combinations thereof.

The mixing may lead to a random distribution of the optionally oxide coated phosphor material and the optionally oxide coated nanoparticles. Some of the particles may be attached to each other via adhesive forces. In some embodiments the forces between the optionally oxide coated phosphor material and the optionally oxide coated nanoparticles are weaker than the attractive forces between the particles and the solvent.

The mixing may be carried out in a suitable solvent, such as cyclohexane, chloroform, octane, tetrachloroethylene, or combinations thereof.

The method may also include coating the optionally oxide coated phosphor material and the optionally oxide coated nanoparticles with an oxide coating to form one or more coated phosphor-nanoparticle agglomerate(s).

In non-limiting embodiments, the phosphor material is oxide coated and/or the paramagnetic nanoparticle is oxide coated. In addition, the phosphor material and/or the paramagnetic nanoparticle may each have two or more oxide coatings. A first oxide coating may be the outermost oxide coating that at least partially or fully covers the phosphor-nanoparticle agglomerate(s) and/or the paramagnetic nanoparticle(s), and a second oxide coating may at least partially or fully cover the first oxide coating. The first oxide coating and/or the second oxide coating may be the same material or a different material.

The oxide coating(s) may be carried out via suitable coating methods. The coating method is selected in a way so as not to destroy the optionally oxide coated phosphor material and the optionally oxide coated nanoparticles but to apply the oxide coating(s) at least partially or fully on the optionally oxide coated phosphor material and the optionally oxide coated nanoparticles. Thus, the coated phosphor-nanoparticle agglomerate(s) is at least partially or fully coated with the oxide coating.

The coated phosphor-nanoparticle agglomerate(s) may include one optionally oxide coated phosphor material and one optionally coated nanoparticle, which are attached to each other via the oxide coating of the coated phosphor-nanoparticle agglomerate. In an alternative embodiment, the coated phosphor-nanoparticle agglomerate may include several optionally oxide coated phosphor materials and several optionally coated nanoparticles, which are attached to each other via the oxide coating of the coated phosphor-nanoparticle agglomerate. The ratio of the optionally oxide coated phosphor material and the optionally coated paramagnetic nanoparticle may be independently selected from a broad range of possibilities. The ratio of the optionally oxide coated phosphor material and the optionally coated paramagnetic nanoparticle are especially selected in view of the light absorbance of the two components at the pump wavelength, i.e. 450 nm. The light absorbed by the optionally coated paramagnetic nanoparticle may be less than 10% of the light absorbed by the optionally oxide coated phosphor material.

The oxide coating of the coated phosphor-nanoparticle agglomerate may be completely cured. The curing may be carried out by letting the coating dry at appropriate temperatures for an appropriate time, such as but not limited to curing at 80° C. for 120 minutes when a $SiO_2$-coating is applied on a quantum dot as phosphor material in a non-limiting embodiment.

The method may include separating the coated phosphor-nanoparticle agglomerate to form a wavelength converter material. For separating the coated phosphor-nanoparticle agglomerate, g a magnetic field may be applied to the coated phosphor-nanoparticle agglomerate. Applying a magnetic field may be understood as placing a magnet near the phosphor nanoparticle solution (e.g. on the outside of the container holding the phosphor nanoparticle solution).

The coated phosphor-nanoparticle agglomerate may be directly attached to the magnet. In an alternative embodiment, the magnet may be placed under a suitable surface, and the coated phosphor-nanoparticle agglomerate(s) may be attached to the surface through the binding forces of the magnet. With the latter non-limiting embodiment, the coated phosphor-nanoparticle agglomerate(s) may be arranged on a desired surface, such as optoelectronic semiconductor chips (e.g., InGaN, or GaN chips).

Suitable magnets may be or include, but are not limited to, electromagnets, permanent magnets, such as neodynium, or combinations thereof.

By applying a magnetic field to the coated phosphor-nanoparticle agglomerates, the coated phosphor-nanoparticle agglomerates may be separated from impurities, by-products, solvents, etc. Possible impurities and/or by-products may be unreacted oxide precursors, partially hydrolyzed oxide precursors, catalysts (acids or bases), ethanol, water, methanol, polymers, surfactants, or combinations thereof.

In a non-limiting embodiment, the method may include shelling the coated phosphor-nanoparticle agglomerate prior to the separating.

Shelling, as described herein, is defined as applying a shell over the oxide coating of the coated phosphor-nanoparticle agglomerates. The shell may at least partially or fully completely cover the oxide coating. In non-limiting embodiments, the coated phosphor-nanoparticle agglomerate may not be completely coated with the oxide coating, and the shell may even be in contact with the optionally oxide coated phosphor material and/or optionally oxide coated paramagnetic nanoparticle agglomerate.

The shelling may influence the resistance of the agglomerate to humidity, radiation, oxygen, or combinations thereof. The shelling may also introduce properties such as hydrophobicity or hydrophilicity. In a non-limiting embodiment, the shelling may not influence the magnetic properties of the coated phosphor-nanoparticle agglomerate.

Suitable shelling materials may be or include any wide band-gap semiconductor that does not absorb the pump wavelength (450 nm), such as ZnS, ZnSeS, ZnSe, AlP, or combinations thereof. In a non-limiting embodiment, the shelling material may be zinc selenide (ZnSe), zinc sulfide (ZnS), silver gallium sulfide ($AgGaS_2$), copper gallium sulfide ($CuGaS_2$), or combinations thereof.

In a non-limiting embodiment, the shelling may be an oxide material, but a different oxide than the oxide material of the oxide coating of the coated phosphor-nanoparticle agglomerate, the optionally oxide coated phosphor material and/or the optionally oxide coated paramagnetic nanoparticle. Non-limiting oxides of the shelling may be or include, but are not limited to, ZnO, $TiO_2$ $ZrO_2$, $Al_2O_3$, $SnO_2$, BaO, or combinations thereof.

The shelling may have a thickness ranging from 1 nm to 50 nm. In a non-limiting embodiment, the shelling may have a thickness ranging from 5 nm to 15 nm, such as from 5 nm to 10 nm.

In a non-limiting embodiment, the optionally oxide coated paramagnetic nanoparticle may be or include Ni, Co, $Fe_3O_4$ (magnetite), $\gamma$-$Fe_2O_3$, Pt, W, Cs, Al, Li, Mg, Na, or a combination thereof. In a non-limiting embodiment, the optionally oxide coated paramagnetic particle may be or include $Fe_3O_4$, $\gamma$-$Fe_2O_3$, or a combination thereof. The optionally oxide coated paramagnetic particle may also be or include Ni, Co, $Fe_3O_4$, $\gamma$-$Fe_2O_3$, Pt, W, Cs, Al, Li, Mg, Na, or a combination thereof and further paramagnetic, or non-paramagnetic elements and/or compounds. The optionally oxide coated paramagnetic nanoparticle may also include a combination of paramagnetic and superparamagnetic elements and/or compounds.

Non-limiting combinations of elements and/or compounds of nanoparticles may be or include $Fe_3O_4$ (magnetite) and $\gamma$-$Fe_2O_3$.

In an embodiment, the oxide coating may be or include, but is not limited to, $SiO_2$, $ZrO_2$, $Al_2O_3$, $TiO_2$, $HfO_2$, MgO, or a combination thereof.

In a non-limiting embodiment, the oxide coating may be or include $SiO_2$, $ZrO_2$, $Al_2O_3$, or a combination thereof.

The oxide may be one oxide or a combination of different oxides. Non-limiting combinations of oxides may be silica and alumina, or silica and zirconia.

In an embodiment, there may be different oxides, e.g., the phosphor material may be coated with an oxide coating (e.g., $SiO_2$); the paramagnetic nanoparticle may be coated with the same or a different oxide coating (e.g., $SiO_2$, or $Al_2O_3$), and the coating of the phosphor-nanoparticle agglomerate may be the same or a different oxide coating (e.g., $SiO_2$, $Al_2O_3$, or MgO). So, in this non-limiting embodiment, there may be two or three different oxide coatings. In a further non-limiting embodiment, there may be multiple layers of each oxide coating for the phosphor material, the paramagnetic material, and/or the agglomerate where each layer of the oxide coating therefor may be different.

The oxide coating and the material selected for the oxide coating may influence the properties of the coated phosphor-nanoparticle agglomerate. The oxide coating may lead to very stable high photoluminescence quantum yield (PLQY) particles and improved moisture resistance, especially if the phosphor is a quantum dot. The oxide coating may act as an insulating coating. In addition, the oxide coating may improve the wet high temperature operating life (WHTOL) of individually encapsulated phosphor-nanoparticle agglomerates, such as quantum dots-nanoparticle agglomerates.

In an embodiment, the method may further include sedimenting the coated phosphor-nanoparticle agglomerate in a slurry of phosphor material and polymers on an optoelectronic semiconductor chip. The optoelectronic semiconductor chip may be any device configured to produce light of a certain first wavelength. In a non-limiting embodiment, the optoelectronic semiconductor chip emits blue light. Non-limiting examples of optoelectronic semiconductor chips are InGaN or GaN chips. Other devices that may also be used as an optoelectronic semiconductor chip are solid state laser diodes.

The method may further include attaching the coated phosphor-nanoparticle agglomerate to an optoelectronic semiconductor chip.

In a further embodiment, the coated phosphor-nanoparticle agglomerate may include from about 0.1 wt. % to about 10 wt. % of the phosphor with respect to the coated phosphor-nanoparticle agglomerate. In a non-limiting embodiment, the coated phosphor-nanoparticle agglomerate may include from about 3 wt. % to about 8 wt. % of the phosphor with respect to the coated phosphor-nanoparticle agglomerate, such as the coated phosphor-nanoparticle agglomerate including from about 5 wt. % to about 6 wt. % of the phosphor with respect to the coated phosphor-nanoparticle agglomerate.

In non-limiting embodiments, the phosphor material is a quantum dot (QD), the QDs may have about 5% of the total mass of the product with about 95% oxide coating. To have the magnetic particle absorb less than 10% of the light, the QDs may have less than about 10% of the mass of the QDs, so 0.5% magnetic particle, 5% QD, 94.5% oxide coating.

The coated phosphor-nanoparticle agglomerate may include from about 0.1 wt. % to about 20 wt. % of the nanoparticle with respect to the coated phosphor-nanoparticle agglomerate. In a non-limiting embodiment, the coated phosphor-nanoparticle agglomerate may include from about 0.2 wt. % to about 5 wt. % of the nanoparticle with respect to the coated phosphor-nanoparticle agglomerate, such as the coated phosphor-nanoparticle agglomerate including from about 0.4 wt. % to about 1 wt. % of the nanoparticle with respect to the coated phosphor-nanoparticle agglomerate.

The coated phosphor-nanoparticle agglomerate may include from about 20 wt. % to about 98 wt. % of the oxide coating with respect to the coated phosphor-nanoparticle agglomerate. In a non-limiting embodiment, the coated phosphor-nanoparticle agglomerate may include from about 50 wt. % to about 96 wt. % of the oxide coating with respect to the coated phosphor-nanoparticle agglomerate, such as the coated phosphor-nanoparticle agglomerate including from about 85 wt. % to about 95 wt. % of the oxide coating with respect to the coated phosphor-nanoparticle agglomerate.

The amounts of the oxide coating and the nanoparticles are selected in a way, so as not to influence the wavelength converting properties when converting light of a pre-determined first wavelength to light of a pre-determined second wavelength.

The embodiments described herein for the phosphor, the oxide coating and the paramagnetic nanoparticle apply also to the wavelength converter material comprising said features.

The phosphor of the wavelength converter material may be or include, but is not limited to, garnets, oxynitridosilicates, perovskites, quantum dots, silicates, or combinations thereof.

In a non-limiting embodiment, the paramagnetic nanoparticle of the wavelength converter material may be or include, but is not limited to, Ni, Co, $Fe_3O_4$ (magnetite), $\gamma$-$Fe_2O_3$, Pt, W, Cs, Al, Li, Mg, Na, or a combination thereof. In a non-limiting embodiment, the paramagnetic particle may be or include, but is not limited to, $Fe_3O_4$, $\gamma$-$Fe_2O_3$, or a combination thereof. The paramagnetic particle may also be a particle comprising an element or a compound selected from the group consisting of Ni, Co, $Fe_3O_4$ (magnetite), $\gamma$-$Fe_2O_3$, Pt, W, Cs, Al, Li, Mg, Na, or a combination thereof and further paramagnetic, or non-paramagnetic elements and/or compounds. The paramagnetic nanoparticle may also include a combination of paramagnetic and superparamagnetic elements and/or compounds.

Thus, each nanoparticle may be the same or different. A first nanoparticle may include a first compound, and the second or more nanoparticles may be or have the same or different nanoparticle compositions. Non-limiting combinations of nanoparticles may be $Fe_3O_4$ (magnetite) and $\gamma$-$Fe_2O_3$.

The amounts of each of the phosphor, the oxide coating, and the nanoparticle in the wavelength converter material, each correspond to the amounts as described herein.

In a non-limiting embodiment, the wavelength converter material may include from about 0.1 wt. % to about 10 wt. % of the phosphor with respect to the wavelength converter material. In a non-limiting embodiment, the wavelength converter material may include from about 3 wt. % to about 8 wt. % of the phosphor with respect to the wavelength converter material, such as the wavelength converter material may include from about 5 wt. % to about 6 wt. % of the phosphor with respect to the wavelength converter material.

The wavelength converter material may include from about 0.1 wt. % to about 20 wt. % of the nanoparticle with respect to the wavelength converter material. In a non-limiting embodiment, the wavelength converter material may include from about 0.2 wt. % to about 5 wt. % of the nanoparticle with respect to the wavelength converter material, such as the wavelength converter material ranging from about 0.4 wt. % to about 1 wt. % of the nanoparticle with respect to the wavelength converter material.

The wavelength converter material may include from about 20 wt. % to about 98 wt. % of the oxide coating with respect to the wavelength converter material. In a non-limiting embodiment, the wavelength converter material may include from about 50 wt. % to about 96 wt. % of the oxide coating with respect to the wavelength converter material, such as the wavelength converter material include from about 85 wt. % to about 95 wt. % of the oxide coating with respect to the wavelength converter material.

A light-emitting diode (LED) may include the wavelength converter material.

A light emitting diode (LED) may further include a light emitting die that emits light of a pre-determined first wavelength. The light emitting die typically emits blue light or UV light as light of a certain first wavelength. Non-limiting light emitting dies are blue light emitting dies. Optoelectronic semiconductor chips may also be used as light emitting dies. Non-limiting optoelectronic semiconductor chips of light emitting dies are InGaN or GaN chips, or solid state laser diodes.

The wavelength converter material may be directly attached to the light emitting die in an LED. Alternatively, there may be a further means between the wavelength converter material and the light emitting die in the LED.

The wavelength converter material may at least partially or completely cover at least one side of the light emitting die.

A LED may also include a further wavelength converter material, such as different phosphors, in addition to the wavelength converter material.

The wavelength converter material may also be used in a method for purification of wavelength converter materials, such as in a method of preparing a light emitting diode (LED).

A method for purification of wavelength converter materials may include isolating wavelength converter materials from a solution or mixture comprising different wavelength converter materials, and/or isolating reaction-byproducts and impurities. In a non-limiting embodiment, the wavelength converter material may be used in such isolation, i.e., purification steps. The wavelength converter material may be isolated from the solution with the help of a magnet and thus purified from the solution.

A method of preparing a light emitting diode (LED) may include positioning the wavelength converter material (e.g., by sedimentation) on a LED die. With the help of a magnet, the wavelength converter material may be positioned exactly at the desired position on the LED die.

In a non-limiting embodiment, QDs may be smaller than traditional phosphors and can be more difficult to sediment onto the LED die within the package of the LED. Sedimentation is a process where phosphor slurries in polymers are deposited into the LED package and then the package is centrifuged to bring the phosphor crystals closer to the optoelectronic semiconductor chip connected to a heat sink. Sedimented phosphors stay cooler under operation, which usually improves their downconversion efficiency and long-term stability at operating conditions.

Wavelength converter materials may be sedimented using a magnetic field, eliminating the need for a centrifugation step. The wavelength converter materials may also be selectively sedimented or resuspended back into the polymer solution, creating additional flexibility for spatial arrangements of QD and phosphors. For example, the phosphors may be sedimented, and then the QDs may be resuspended into the polymer solution using a magnetic field in a situation where the phosphor has a poor high temperature performance and the QD has poor high flux performance.

FIG. 1 shows a method 100 for preparing a wavelength converter material. A phosphor material is provided at 'A'. The phosphor material is mixed with a paramagnetic nanoparticle and one or more oxide coatings is grown on the two materials at 'B'. The oxide coated phosphor and oxide coated paramagnetic nanoparticle of 'B' are coated with an oxide coating at 'C' to form a phosphor-nanoparticle agglomerate. The coated phosphor-nanoparticle agglomerate is separated at 'D' by applying a magnet to the solution with the coated phosphor-nanoparticle agglomerate.

Figure 2:
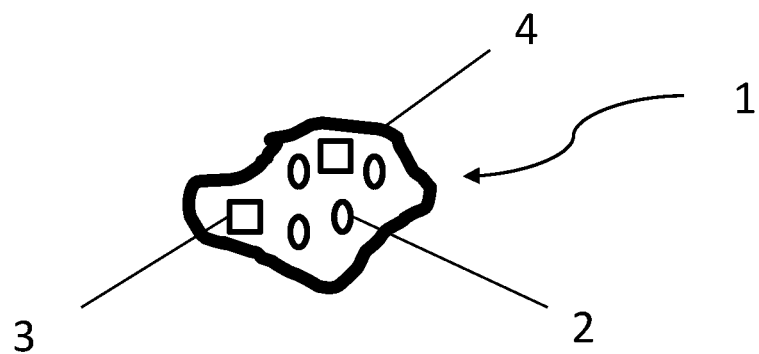
FIG. 2 depicts a wavelength converter material.

FIG. 2 shows a non-limiting wavelength converter material 1. The wavelength converter material 1 may include a phosphor material 2 optionally coated with an oxide coating, a paramagnetic nanoparticle 3 optionally coated with an oxide coating, and an oxide coating 4 surrounding the phosphor material 2 and the paramagnetic nanoparticle 3.

Figure 3:
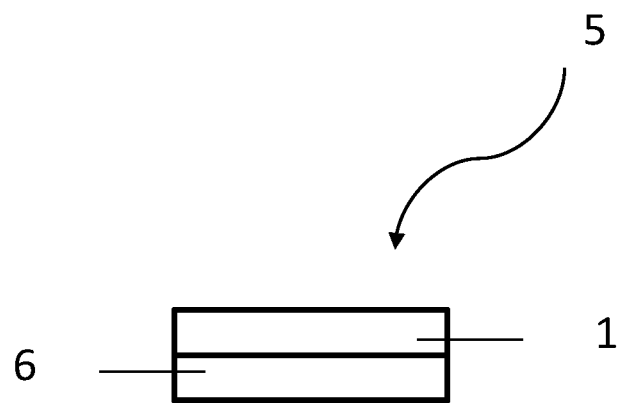
FIG. 3 depicts a light emitting diode.

FIG. 3 shows an exemplary light emitting diode (LED) 5 including the wavelength converter material 1 and a LED die 6.

EXAMPLE 20 grams dioctyl sulfosuccinate, as a surfactant, were dissolved in 30 mL hexane with sonication and stirring. Separately, a QD solution (e.g., CdSe/ZnSe/ZnS) was prepared containing 30 nanomoles of QDs in 18 mL cyclohexane. A solution of magnetite nanoparticles in cyclohexane was then prepared with an absorbance at 450 nm equal to that of the aforementioned QD solution, 2 mL of this solution was mixed with the 18 mL of QD solution. The QD/magnetite nanoparticle solution was then added to the solution of dioctyl sulfosuccinate and stirred for 1 hour. A 50% by volume water/ethanol solution was prepared. 1 g aluminum isopropoxide was added to the stirring QD solution followed by 3 mL of 50% by volume water/ethanol solution. After one hour, an additional 1 g of aluminum isopropoxide and 3 g of water/ethanol were added. After 1 hour of reaction, 100 mL of isopropanol was added while stirring, the solution was centrifuged to obtain a solid, colored pellet containing the QDs, magnetite and alumina. The supernatant was discarded, the pellet was dried in air for 10 minutes and redispersed in 20 mL of toluene and crashed with 30 mL of isopropanol and centrifuged. The supernatant was discarded and the solid product dried in air for 10 minutes. At this stage, individual quantum dots and magnetite nanoparticles were encapsulated in alumina, in the following reaction additional alumina was deposited to agglomerate these particles into larger structures containing multiple QDs and magnetite particles.

The solid pellet was redispersed in a solution consisting of 30 mL hexane and 20 grams dioctyl sulfosuccinate. The solution was stirred at room temperature for 1 hour followed by 4 additions of both 1 g aluminum isopropoxide and 3 mL 50% water/ethanol with the 4 additions spaced 30 minutes apart. The solution was allowed to react for 4 hours. When the reaction was complete stirring was ceased and a neodymium permanent magnet was held to the outside of the flask for 2 minutes to collect all of the solid material. The colorless liquid was discarded. If desired the obtained product can be further washed.

While non-limiting embodiments have been described, it will be apparent to those skilled in the art that various changes and modifications can be made herein without departing from the scope of the invention as defined by the appended claims. The disclosure includes any new feature as well as any combination of features, which in particular includes any combination of features in the appended claims, even if the feature or combination is not per se explicitly indicated in the claims or the examples.

The invention claimed is:

1. A method of preparing a wavelength converter material comprising:
    providing one or more phosphor materials; wherein the one or more phosphor materials comprises an optional oxide coating;
    mixing one or more phosphor materials with one or more paramagnetic nanoparticles; wherein the one or more paramagnetic nanoparticles is optionally coated with an optional oxide coating;
    coating the one or more phosphor materials and the one or more paramagnetic nanoparticles with an oxide coating to form a coated phosphor-nanoparticle agglomerate,
    shelling the coated phosphor-nanoparticle agglomerate,
    separating the shelled and coated phosphor-nanoparticle agglomerate and forming a wavelength converter material,
    wherein the separating the shelled and coated phosphor-nanoparticle particle occurs by applying a magnetic field.

2. The method according to claim 1, wherein the one or more phosphor materials is a quantum dot selected from CdS, CdSe, CdTe, ZnO, ZnS, ZnSe, ZnTe, InN, GaN, InP, GaP, AlP, InAs, GaAs or combinations thereof.

3. The method according to claim 1, wherein the one or more paramagnetic nanoparticles is selected from the group consisting of Ni, Co, $Fe_3O_4$ (magnetite), $\gamma$-$Fe_2O_3$, Pt, W, Cs, Al, Li, Mg, Na, and a combination thereof.

4. The method according to claim 1, wherein the oxide coating of the one or more phosphor materials, the oxide coating of the one or more paramagnetic nanoparticles, the oxide coating of the coated phosphor-nanoparticle agglomerate, and combinations thereof is selected from the group consisting of $SiO_2$, $ZrO_2$, $Al_2O_3$, $TiO_2$, $HfO_2$, MgO, and a combination thereof.

5. The method according to claim 1, wherein the one or more phosphor materials is selected from LuAG:Ce, LuAGaG:Ce, YAGaG:Ce, YAG:Ce, $Sr(Sr,Ca)Si_2Al_2N_6:Eu^{2+}$, $CaAlSiN_3:Eu^{2+}$, $K_2SiF_6:Mn^{4+}$, $\beta$-$SiAlON:Eu^{2+}$ $(Ba,Sr)_2Si_5N_8:Eu^{2+}$, Ca-$\alpha$-$SiAlON:Eu^{2+}$, YAG:Ce+ $CaAlSiN_3:Eu$, $(Ca,Sr)AlSiN_3:Eu^{2+}$, $(Sr,Ca)Al_2Si_2N_6:Eu^{2+}$, $(Ba,Sr,Ca)_2Si_5N_8:Eu^{2+}$, $Sr(LiAl_3N_4):Eu^{2+}$, or combinations thereof.

6. The method according to claim 1, further comprising attaching the coated phosphor-nanoparticle agglomerate to an optoelectronic semiconductor chip.

7. The method according to claim 1, wherein the coated phosphor-nanoparticle agglomerate comprises from about 0.1 wt. % to about 10 wt % of the one or more phosphor materials with respect to the one or more coated phosphor-nanoparticle particles.

8. The method according to claim 4, wherein the one or more phosphor materials comprises the oxide coating.

9. The method according to claim 4, wherein the one or more paramagnetic nanoparticles comprises the oxide coating.

10. The method according to claim 4, wherein the one or more phosphor materials comprises the oxide coating, wherein the one or more paramagnetic materials comprises the oxide coating, and wherein the oxide coating for the one or more phosphor materials is different from the oxide materials for the one or more paramagnetic nanoparticles.

11. The method according to claim 4, wherein the one or more phosphor materials comprises the oxide coating, wherein the one or more paramagnetic materials comprises the oxide coating; and wherein the oxide coating of the coated phosphor-nanoparticle agglomerate is different from the oxide coating of the one or more phosphor materials, the oxide coating of the one or more paramagnetic materials, or both.

12. A wavelength converter material prepared by a method according to claim 1.

13. A wavelength converter material comprising:
   one or more agglomerates comprising:
      one or more phosphors;
      one or more paramagnetic nanoparticles; and
      one or more oxide coatings surrounding the one or more phosphors and the
      one or more paramagnetic nanoparticles; and
   an oxide shell at least partially covering at least a portion of the one or more agglomerates.

14. The wavelength converter material according to claim 13, wherein the one or more phosphors is a quantum dot.

15. The wavelength converter material according to claim 13, wherein the one or more paramagnetic nanoparticles is selected from the group consisting of Ni, Co, $Fe_3O_4$ (magnetite), $\gamma\text{-}Fe_2O_3$, Pt, W, Cs, Al, Li, Mg, Na, and a combination thereof.

16. A light emitting diode (LED) comprising a wavelength converter material according to claim 13.

\* \* \* \* \*